(12) United States Patent
Komatsu et al.

(10) Patent No.: US 10,773,410 B2
(45) Date of Patent: Sep. 15, 2020

(54) METHOD OF FORMING CUT GROOVE

(71) Applicant: DISCO CORPORATION, Tokyo (JP)

(72) Inventors: Atsushi Komatsu, Tokyo (JP); Atsushi Takagi, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 709 days.

(21) Appl. No.: 15/091,076

(22) Filed: Apr. 5, 2016

(65) Prior Publication Data

US 2016/0297091 A1 Oct. 13, 2016

(30) Foreign Application Priority Data

Apr. 9, 2015 (JP) .................................. 2015-080297

(51) Int. Cl.
| | |
|---|---|
| *B26D 3/06* | (2006.01) |
| *H01L 21/78* | (2006.01) |
| *H01L 21/66* | (2006.01) |
| *H01L 21/304* | (2006.01) |
| *G01B 11/22* | (2006.01) |

(52) U.S. Cl.
CPC .............. *B26D 3/065* (2013.01); *H01L 21/78* (2013.01); *H01L 22/20* (2013.01); *G01B 11/22* (2013.01); *H01L 21/3043* (2013.01); *H01L 22/12* (2013.01)

(58) Field of Classification Search
CPC ....... H01L 21/3043; B26D 3/06; B26D 3/065; B26D 3/08; B26D 3/085; Y10T 83/0304–0393; Y10T 83/0215; Y10T 83/0222; Y10T 83/0495; Y10T 83/9291; Y10T 225/12; Y10T 225/307; G01B 11/22; G01B 5/18

USPC ..... 83/875–887, 863, 864, 33, 929.1; 225/2, 225/94

See application file for complete search history.

(56) References Cited

U.S. PATENT DOCUMENTS

| 6,500,683 B1 * | 12/2002 | Nakabayashi ......... G01B 11/22 438/14 |
| 9,673,351 B2 * | 6/2017 | Minamiru ............... H01L 21/78 |
| 2005/0009302 A1 * | 1/2005 | Wakui ..................... H01L 21/78 438/464 |
| 2006/0148211 A1 * | 7/2006 | Iwasaki ............. H01L 21/67092 438/462 |

(Continued)

FOREIGN PATENT DOCUMENTS

| JP | 2005-150523 | 6/2005 |
| JP | 2013-059833 A | * 4/2013 |
| JP | 2015-018965 | 1/2015 |

*Primary Examiner* — Evan H MacFarlane
(74) *Attorney, Agent, or Firm* — Greer Burns & Crain Ltd.

(57) ABSTRACT

A cut groove having a predetermined depth is formed with a cutting blade along a projected dicing line set on a workpiece. A first preliminary groove is cut in a measurement member and a relational expression with respect to a distance from the preliminary groove bottom and the width of the preliminary groove is determined. An amount of incision into the workpiece is set to be equal to or smaller than a predetermined value from a reference position and the thickness of the workpiece. A second preliminary groove is cut along the projected dicing line, and an image of the second preliminary cut groove is captured. The width of the second preliminary cut groove is measured, and the depth of the second preliminary cut groove is calculated from the width of the second preliminary groove and the relational expression.

8 Claims, 11 Drawing Sheets

(56) References Cited

U.S. PATENT DOCUMENTS

| | | | |
|---|---|---|---|
| 2009/0049964 A1* | 2/2009 | Yagyu | B24B 13/015 83/34 |
| 2015/0194354 A1* | 7/2015 | Cheng | H01L 22/20 438/7 |
| 2015/0318210 A1* | 11/2015 | Budd | H01L 21/304 438/463 |
| 2016/0027696 A1* | 1/2016 | Nagaoka | H01L 21/6835 438/14 |

* cited by examiner

METHOD OF FORMING CUT GROOVE

BACKGROUND OF THE INVENTION

Field of the Invention

The present invention relates to a method of forming a cut groove in a workpiece such as a wafer or the like along a projected dicing line set on the workpiece.

Description of the Related Art

In the process for fabricating semiconductor devices, it has been customary to define a plurality of regions on the surface of a semiconductor wafer, such as a silicon wafer, a gallium arsenide wafer, or the like which is in the shape of a substantially circular plate, with projected dicing lines referred to as streets formed in a grid pattern, and to form devices such as ICs, LSI circuits, or the like in the respective regions. After the semiconductor wafer has been ground on its reverse side to a predetermined thickness by a grinding apparatus, the semiconductor wafer is divided by a cutting apparatus or a laser machining apparatus into individual devices that will widely be used in various electric devices including cellular phones, personal computers, etc.

A cutting apparatus which is generally called a dicing saw is used as the cutting apparatus referred to above. The cutting apparatus includes a cutting blade having a cutting edge which is made of a superabrasive such as diamond, CBN, or the like bound together by metal or resin and has a thickness in the range from 20 μm to 30 μm. While the cutting blade is rotating at a high speed of about 30000 rpm or the like, it incises the semiconductor wafer to cut the same.

Each of the semiconductor devices formed on the surface of the semiconductor wafer includes metal interconnects deposited in several layers for transmitting signals. The layered metal interconnects are insulated from each other by interlayer insulating films that are mainly made of $SiO_2$. In recent years, structural miniaturization results in smaller distances between interconnects, increasing the electric capacitance between adjacent interconnects. This causes signal delays, making manifest the problem of increased electric power consumption.

In order to reduce parasitic capacitances between layers, it has heretofore been the practice to mainly employ $SiO_2$ insulating films as interlayer insulating films at the time of forming devices (circuits). However, low-dielectric-constant insulating films (low-k films) whose dielectric constants are lower than $SiO_2$ insulating films have recently started to find use. Such low-dielectric-constant insulating films include materials having dielectric constants (e.g., dielectric constant k=about 2.5 through 3.6) lower than that (k=4.1) of $SiO_2$ insulating films, for example, inorganic films of SiOC, SiLK, etc., organic films as polymer films of polyimide, parylene, polytetrafluoroethylene, etc., and porous silica films of methyl-contained polysiloxane, etc.

When a laminated body including low-dielectric-constant insulating films is cut along projected dicing lines by a cutting blade, the laminated body tends to flake as the low-dielectric-constant insulating films are very brittle like mica. Heretofore, there has been known a processing method based on a combination of laser dicing and mechanical dicing as a method of well dividing a semiconductor wafer of the above type into individual chips (see, for example, Japanese Patent Laid-Open No. 2005-150523).

According to the above wafer processing method, a laser beam is applied to the surface of the semiconductor wafer to form laser-processed grooves dividing the laminated body which includes a low-k film and a functional film, and then a substrate exposed on the bottom surfaces of the laser-processed grooves is cut by a cutting blade, dividing the semiconductor wafer into individual device chips. The wafer processing method makes it possible to divide the semiconductor wafer into individual device chips while preventing the low-k film from flaking off. However, the wafer processing method is problematic in that because it is necessary to use a laser processing apparatus in addition to a cutting apparatus, the cost of the apparatus used is high.

Methods of cutting a low-k film without flaking it off by way of mechanical dicing without the use of a laser processing apparatus have been researched and developed from day to day. A very shallow-cutting processing method of removing a low-k film with a cutting blade which has a cross-sectionally U-shaped or V-shaped tip end is described in Japanese Patent Laid-Open No. 2015-18965.

SUMMARY OF THE INVENTION

However, the processing method described in Japanese Patent Laid-Open No. 2015-18965 is likely to cause a problem in that if the incision depth for the cutting blade is wrong, then the width of cut grooves may increase to a range in excess of the projected dicing lines, tending to remove devices on the semiconductor wafer or to cause a portion, which is not of a round shape, of the tip end of the cutting blade to contact the low-k film to flake it off.

It is therefore an object of the present invention to provide a method of forming cut grooves to an accurate depth in a workpiece along projected dicing lines thereon.

In accordance with an aspect of the present invention, there is provided a method of forming a cut groove having a predetermined depth in a workpiece with a cutting blade along a projected dicing line set on the workpiece. The method includes a relational expression determining step of cutting a measurement member with the cutting blade to form a first preliminary cut groove therein and determining a relational expression with respect to a distance from a groove bottom of the first preliminary cut groove and a groove width of the first preliminary cut groove, a reference position setting step of setting a position where a tip end of the cutting blade and a holding surface of a chuck table contact each other as a reference position for incising feed means for moving the cutting blade and the chuck table relatively to each other along a incising feed direction perpendicular to the holding surface of the chuck table, and a preliminary cut groove forming step of, after the relational expression determining step and the reference position setting step have been carried out, setting an amount of incision into the workpiece as being equal to or smaller than a predetermined value from the reference position and the thickness of the workpiece and forming a second preliminary cut groove in the workpiece held on the chuck table with the cutting blade along the projected dicing line. The method further includes a depth calculating step of, after the preliminary cut groove forming step has been carried out, capturing an image of the second preliminary cut groove, measuring a groove width of the second preliminary cut groove, and calculating a depth of the second preliminary cut groove from the groove width of the second preliminary cut groove and the relational expression, an amount-of-incision resetting step of resetting an amount of incision for the cutting blade to form a cut groove having a predetermined depth in the workpiece, using a corrective value represented by the difference between the amount of incision set in the preliminary cut groove forming step and the depth of the second preliminary cut groove calculated in the depth calculating step, and a processing step of, after the amount-of-incision resetting step has been carried out, forming a cut groove having a predetermined depth in the workpiece with the cutting blade along the projected dicing line by the amount of incision set in the amount-of-incision resetting step.

Preferably, the processing step includes cutting the cut groove along the second preliminary cut groove. Preferably, the preliminary cut groove forming step, the depth calculating step, and amount-of-incision resetting step are carried out a plurality of times along different projected dicing lines with respect to the workpiece held on the chuck table.

With the method of forming a cut groove according to the present invention, a measurement member is cut by a cutting blade to form a first preliminary cut groove therein and a relational expression is determined in advance with respect to a distance from a groove bottom of the first preliminary cut groove and a groove width of the first preliminary cut groove. Thereafter, a second preliminary cut groove is formed in a workpiece to an incision depth smaller than a planned depth to be processed, and a corrective value is calculated from the difference between a set amount of incision and the actual depth of the groove. An amount of incision is reset for the cutting blade using the corrective value, and a cut groove is formed in the workpiece by the reset amount of incision. Therefore, a groove can be cut to an accurate depth in the workpiece.

The above and other objects, features and advantage of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
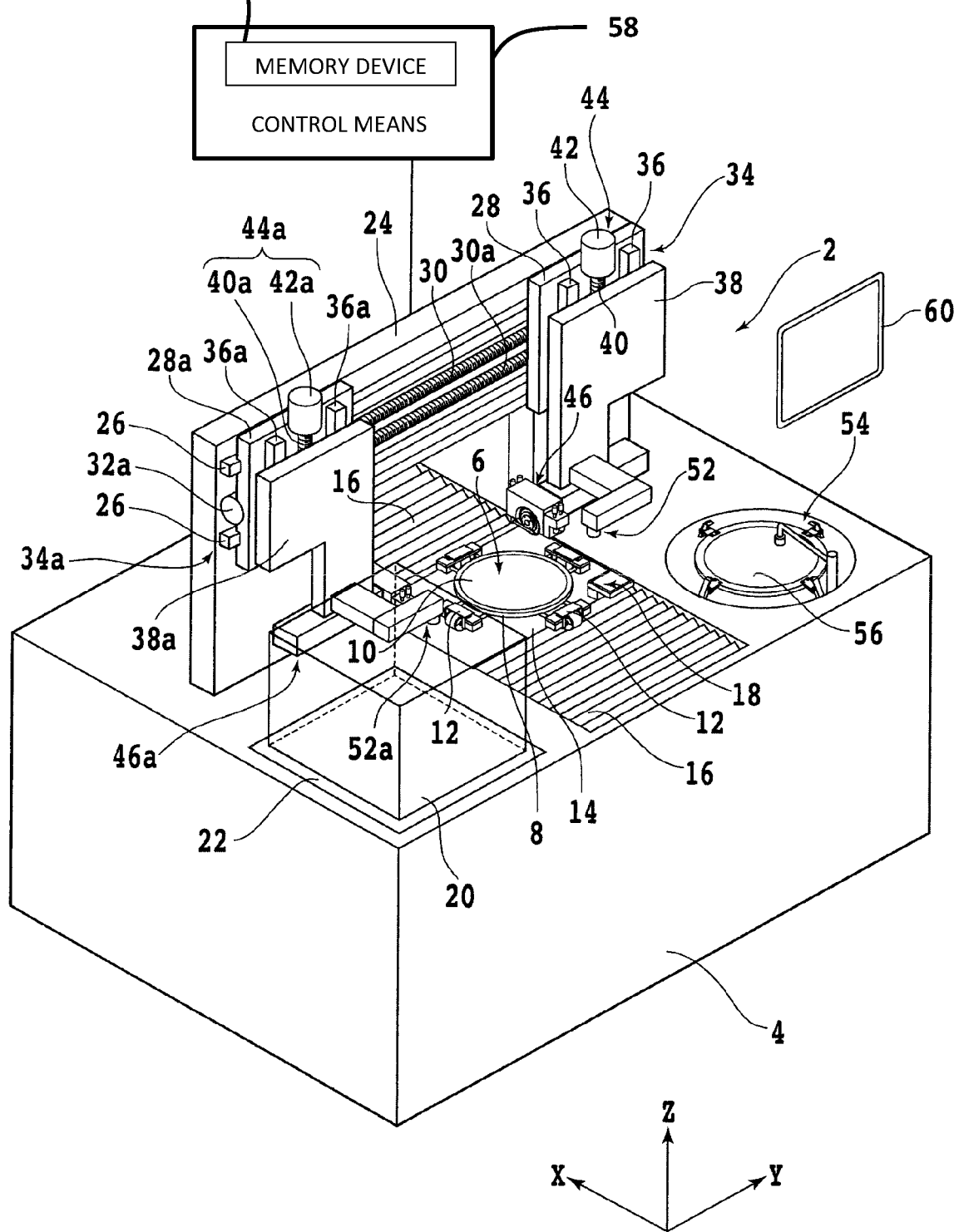
FIG. 1 is a perspective view of a cutting apparatus which is suitable for carrying out a method of forming a cut groove according to the present invention.

An embodiment of the present invention will be described in detail below with reference to the drawings. FIG. 1 shows in perspective a cutting apparatus 2 which is suitable for carrying out a method of forming a cut groove according to the present invention. As shown in FIG. 1, the cutting apparatus 2 is a cutting apparatus of the facing dual spindle type wherein two cutting blades are disposed in facing relation to each other. The cutting apparatus 2 includes a base 4 with a chuck table 6 disposed thereon which is movable back and forth along X-axis directions by a processing feed mechanism, not shown. The chuck table 6 includes a frame 8 made of metal such as SUS or the like and a suction holder 10 made of porous ceramics or the like and disposed in the frame 8. The cutting apparatus 2 also has a plurality of clamps 12 and a water cover 14 disposed around the chuck table 6. A corrugated panel 16 extends between and is connected to the water cover 14 and the base 4. An auxiliary chuck table 18 for holding a measurement member such as a dummy wafer is disposed on the water cover 14 adjacent to the chuck table 6.

Figure 2:
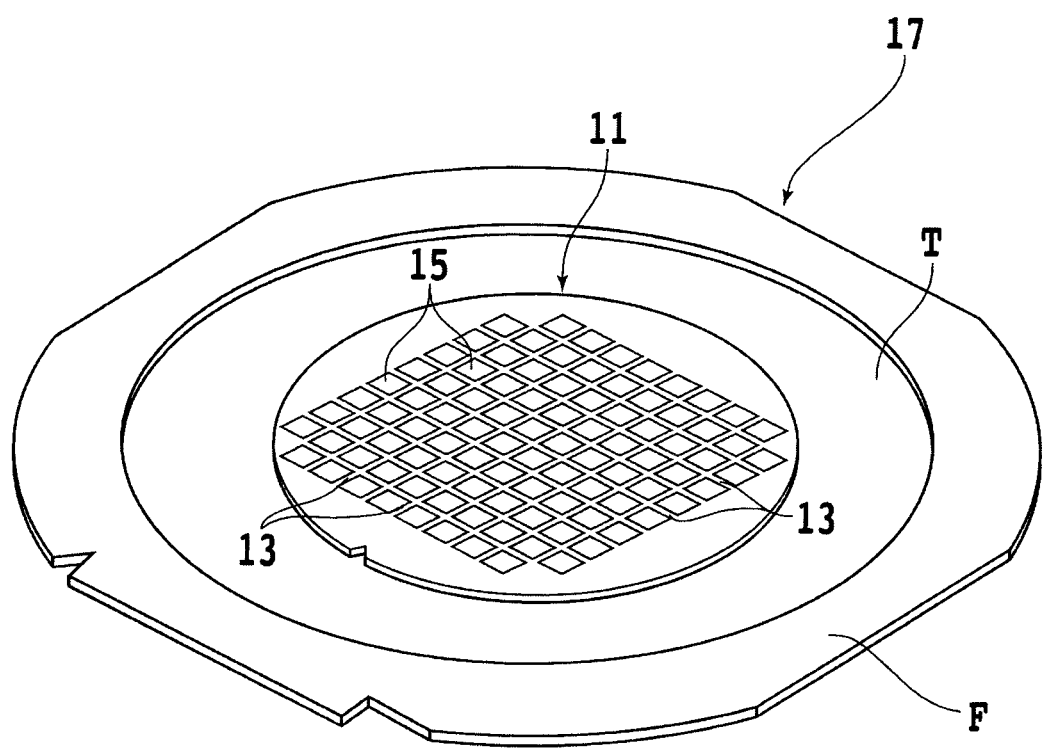
FIG. 2 is a perspective view of a wafer unit.

FIG. 2 shows a wafer unit 17 in perspective. The wafer unit 17 includes an annular frame F and a semiconductor wafer (hereinafter also referred to as wafer) 11 whose reverse side is adhered to a dicing tape T having an outer peripheral portion adhered to the annular frame F. The wafer 11 has on its surface devices 15 such as ICs, LSI circuits, or the like formed in respective regions that are defined by a plurality of projected dicing lines 13 arranged in a grid pattern. The wafer unit 17 shown in FIG. 2 is illustrated as including the semiconductor wafer 11 as a workpiece to be processed. However, the workpiece is not limited to the semiconductor wafer 11, but may be planar workpieces including other wafers such as an optical device wafer with a plurality of optical devices formed on its surface.

Referring back to FIG. 1, a plurality of wafer units 17 are housed in a cassette 20 which is placed on a vertically movable cassette elevator 22. A portal-shaped column 24 is erected on a rear portion of the base 4. A pair of guide rails 26 extending along Y-axis directions are fixed to the column 24. On the column 24, there is mounted a first Y-axis movable block 28 which is movable along the Y-axis directions by a first Y-axis moving mechanism 34 including a ball screw 30 and a pulse motor, not shown, while being guided by the guide rails 26.

A pair of guide rails 36 extending along Z-axis directions are fixed to the first Y-axis movable block 28. On the first Y-axis movable block 28, there is mounted a first Z-axis movable block 38 which is movable along the Z-axis directions by a first Z-axis moving mechanism 44 including a ball screw 40 and a pulse motor 42, while being guided by the guide rails 36. A first cutting unit 46 and a first image capturing unit 52 are mounted on the first Z-axis movable block 38.

Figure 3:
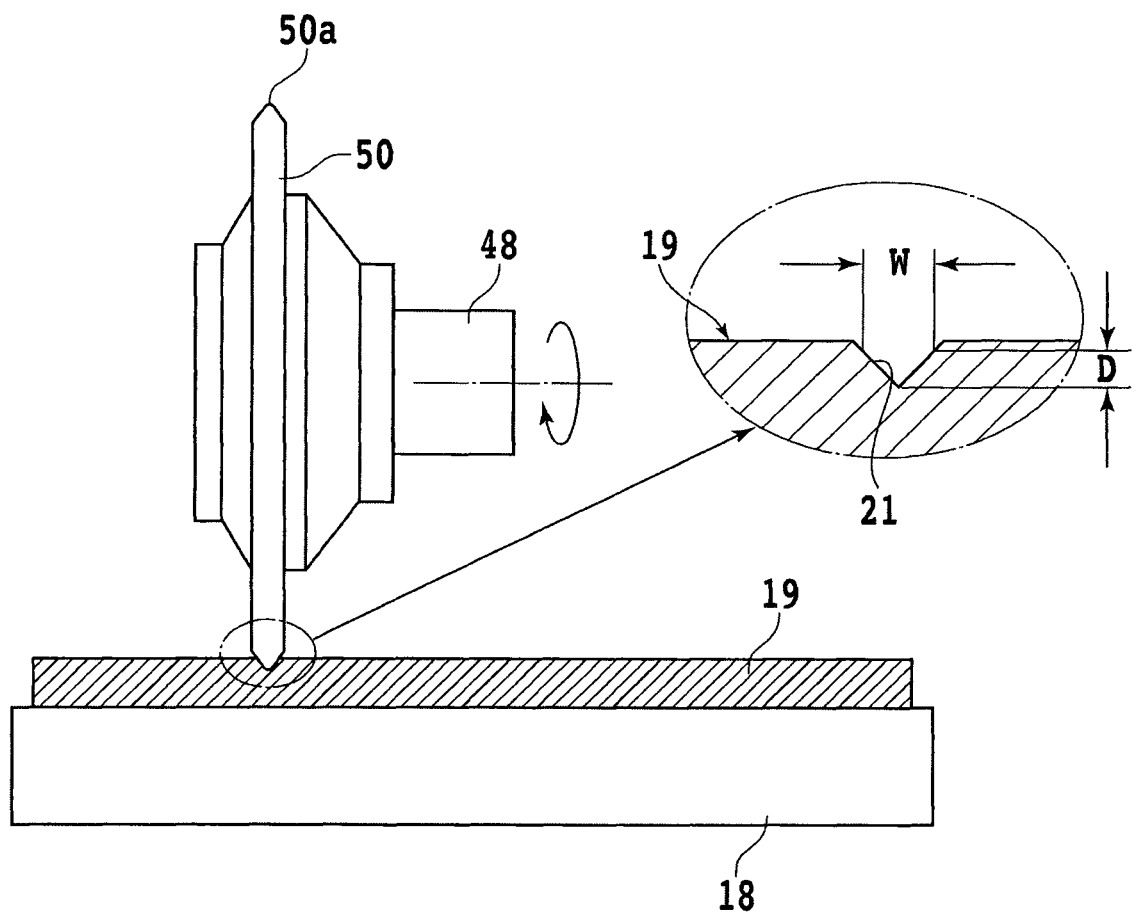
FIG. 3 is a side elevational view, partly in cross section, illustrating a first preliminary cut groove forming step.

As shown in FIG. 3, the first cutting unit 46 includes a spindle 48 rotatable about its own axis by a motor, not shown, and a first cutting blade 50 detachably mounted on a distal end portion of the spindle 48. The first cutting blade 50 has a tip end 50a which is of a generally V cross-sectional shape whose crest should preferably be round. The first cutting blade 50 should preferably be a relatively thick cutting blade whose cutting edge has a thickness of about 500 μm.

Referring back to FIG. 1, the portal-shaped column 24 also supports thereon a second Y-axis movable block 28a which is movable along the Y-axis directions by a second Y-axis moving mechanism 34a including a ball screw 30a and a pulse motor 32a while being guided by the guide rails 26. A pair of guide rails 36a extending along the Z-axis directions are fixed to the second Y-axis movable block 28a.

On the second Y-axis movable block 28a, there is mounted a second Z-axis movable block 38a which is movable along the Z-axis directions by a second Z-axis moving mechanism 44a including a ball screw 40a and a pulse motor 42a while being guided by the guide rails 36a.

A second cutting unit 46a and a second image capturing unit 52a are mounted on the second Z-axis movable block 38a. The second cutting unit 46a includes a spindle rotatable about its own axis by a motor, not shown, and a second cutting blade, not shown, detachably mounted on a distal end portion of the spindle. The second cutting blade includes an electroformed blade whose cutting edge has a thickness of about 30 μm, for example.

A spinner cleaning unit 54 which has a spinner table 56 attracts and holds a wafer 11 that has been cut on the spinner table 56, spinningly cleans the wafer 11, and thereafter spinningly dries the wafer 11. The various mechanisms of the cutting apparatus 2 are controlled by control means (controller) 58. A touch-panel display monitor 60 is mounted on an outer panel, not shown, of the cutting apparatus 2. The touch-panel display monitor 60 displays operating status of the cutting apparatus 2, and is also used to enter control commands for the cutting apparatus 2.

Referring to FIGS. 1-11, the method of forming a cut groove according to the present invention will be described in detail below. The suction holder 10 of the chuck table 6 has an upper surface serving as a holding surface which does not lie completely horizontally, but contains a height error in the range of about 3 μm to 8 μm, for example. Furthermore, since the wafer 11 has a thickness variation in the range of 1 μm to 3 μm and each of the axes of the cutting apparatus 2 varies by about 2 μm depending on the temperature, in order to manage the incision depth for the cutting blade 50 with the accuracy of about ±1 μm, for example, the accurate depth of a cut groove cannot be measured unless the cutting blade 50 actually incises a workpiece.

The method of forming a cut groove according to the present invention has been developed for forming a cut groove to an accurate depth in the workpiece by correcting the height error of the holding surface of the chuck table 6 and the thickness variation of the workpiece, etc. In the method of forming a cut groove according to the present invention, as shown in FIG. 3, a measurement member cutting step is first carried out to cause the auxiliary chuck table 18 to attract and hold a measurement member 19 such as a dummy wafer thereon, and to cause the cutting blade 50 to cut the measurement member 19 to form a first preliminary cut groove 21 therein. Specifically, the tip end 50a which is cross-sectionally V-shaped incises the measurement member 19 by a shallow depth to form the first preliminary cut groove 21 in the measurement member 19.

After the measurement member cutting step has been carried out, the measurement member 19 with the first preliminary cut groove 21 formed therein is removed from the auxiliary chuck table 18, and the cross-sectional shape of the first preliminary cut groove 21 is observed using a microscope. The relationship between a depth D from the groove bottom of the first preliminary cut groove 21 and a groove width W of the first preliminary cut groove 21 is detected at a plurality of locations along the first preliminary cut groove 21. A relational expression (table) shown in Table 1 below is produced from the detected relationship, and stored in a memory device 59 of the control means or controller 58 (relational expression determining step).

TABLE 1

| Distance D from groove bottom | Groove width W |
|---|---|
| 3 | 8 |
| 6 | 12 |
| 9 | 19 |
| 12 | 24 |
| 15 | 30 |

(unit: μm)

Before or after the relational expression determining step, a process of setting up the cutting blade 50 to detect a reference vertical position for the cutting blade 50 is carried out. Specifically, a reference position setting step is carried out to set the position where the tip end 50a of the cutting blade 50 and the holding surface of the chuck table 6 contact each other as a reference position for the incising feed means (first Z-axis moving mechanism) 44 for moving the cutting blade 50 and the chuck table 6 relatively to each other along incising feed directions (Z-axis directions) perpendicular to the holding surface of the chuck table 6.

Figure 4:
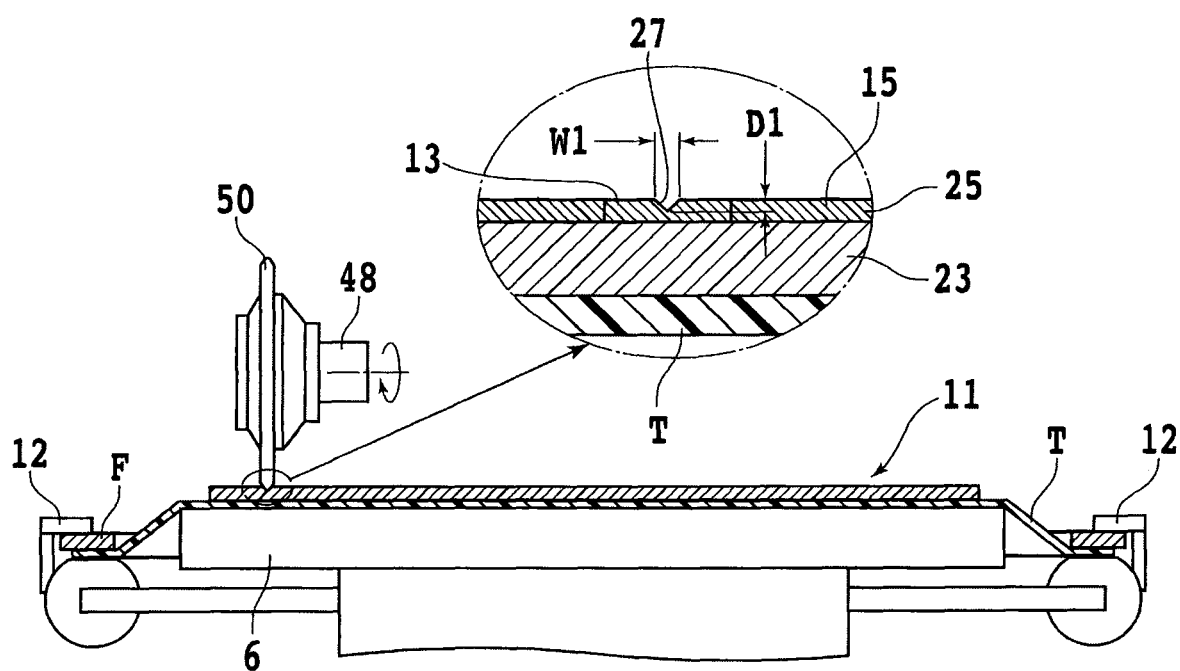
FIG. 4 is a side elevational view, partly in cross section, illustrating a preliminary cut groove forming step of forming a second preliminary cut groove.

After the relational expression determining step and the reference position setting step have been carried out, a preliminary cut groove forming step is carried out to set an amount of incision into the wafer (workpiece) 11 as being equal to or smaller than a predetermined value from the reference position and the thickness of the wafer 11, and, as shown in FIG. 4, and to form a second preliminary cut groove 27 in the wafer 11 held on the chuck table 6 along a projected dicing line 13 with the cutting blade 50 which is rotating at a high speed.

The semiconductor wafer 11 includes a silicon substrate 23 and a laminated body 25 deposited on the silicon substrate 23, the laminated body 25 including low-dielectric-constant insulating films (low-k films) and functional films which are deposited in a plurality of layers. The semiconductor wafer 11 also has a plurality of devices 15 formed in respective regions that are defined by a plurality of projected dicing lines 13 arranged in a grid pattern on the laminated body 25. The second preliminary cut groove 27 formed in the preliminary cut groove forming step have a depth D1 smaller than the thickness of the laminated body 25, and the second preliminary cut groove 27 includes a groove width W1.

Figure 5:
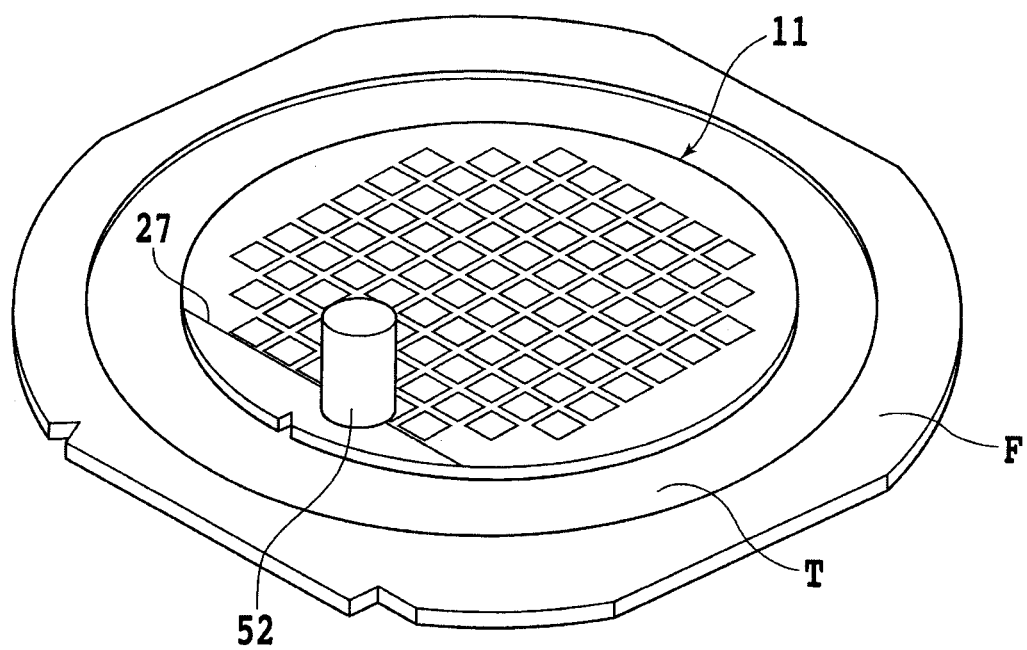
FIG. 5 is a schematic perspective view showing an image capturing step.
Figure 6:
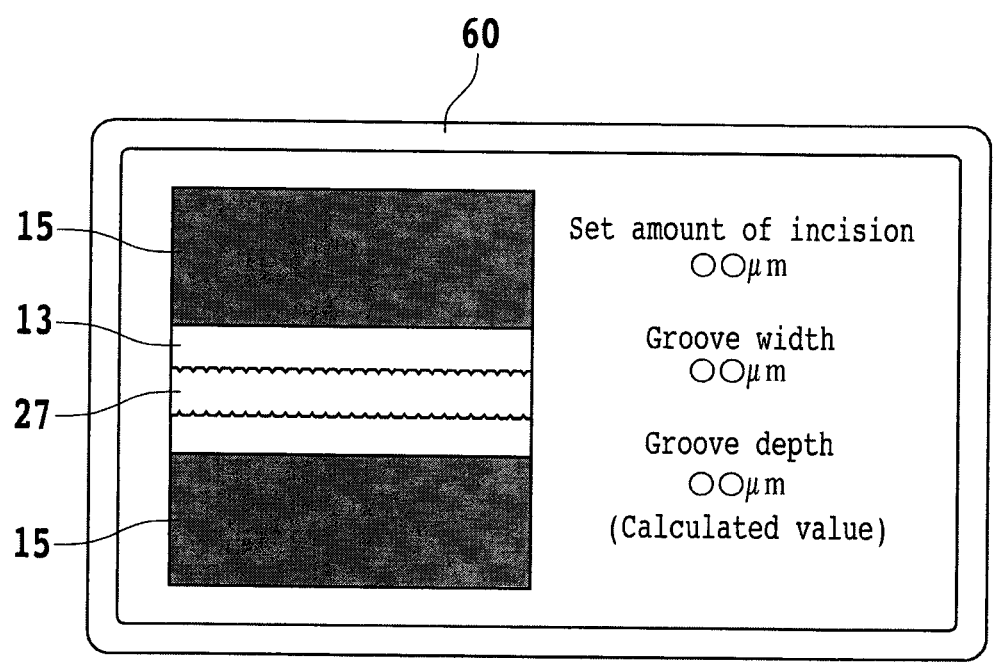
FIG. 6 is a view showing a captured image of the second preliminary cut groove which is displayed on a display monitor.

After the preliminary cut groove forming step has been carried out, an image of the second preliminary cut groove 27 is captured by the first image capturing unit 52 as shown in FIG. 5, and the captured image is displayed on the display monitor 60 as shown in FIG. 6. The width of the second preliminary cut groove 27 is detected, and the depth of the second preliminary cut groove 27 is calculated from the detected groove width and the relational expression determined in the relational expression determining step (depth calculating step). Then, an amount-of-incision resetting step is carried out to reset an amount of incision for the cutting blade to form a cut groove having a predetermined depth, using a corrective value represented by the difference between the amount of incision set in the preliminary cut groove forming step and the depth of the second preliminary cut groove calculated in the depth calculating step.

Figure 7:
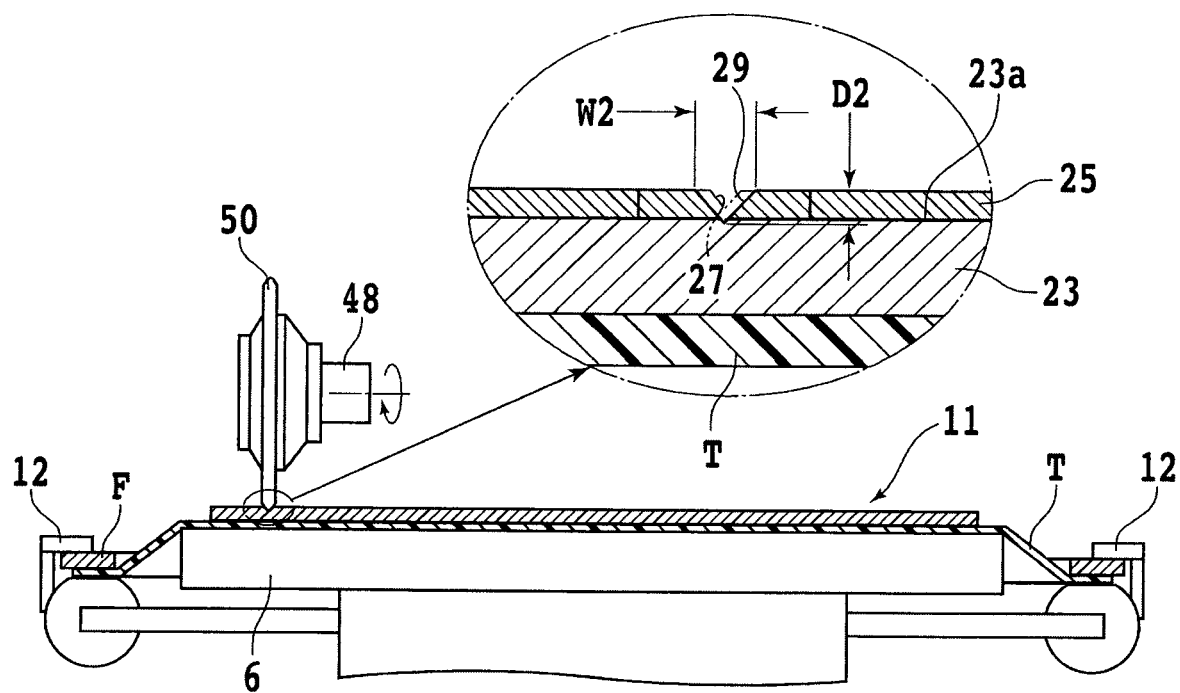
FIG. 7 is a side elevational view, partly in cross section, illustrating a processing step.

After the amount-of-incision resetting step has been carried out, as shown in FIG. 7, a processing step is carried out to cause the cutting blade 50 rotating at a high speed to incise the wafer 11 by the reset amount of incision, forming a cut groove 29 of a predetermined depth D2 in the wafer 11 along a projected dicing line 13. At this time, the cut groove 29 has a groove width W2. The predetermined depth D2 is a depth by which the cutting blade 50 completely severs the laminated body 25 and incises the substrate 23 slightly from its surface 23a. In the processing step, the cut groove 29 of the predetermined depth D2 is formed along the second preliminary cut groove 27. Since the depth D2 of the cut groove 29 formed in the processing step is a depth by which the laminated body 25 is completely severed and the substrate 23 is slightly incised, the low-k films are prevented from flaking off even when the cutting blade of the second cutting unit 46a dices the wafer 11 along the cut groove 29.

Figure 8:
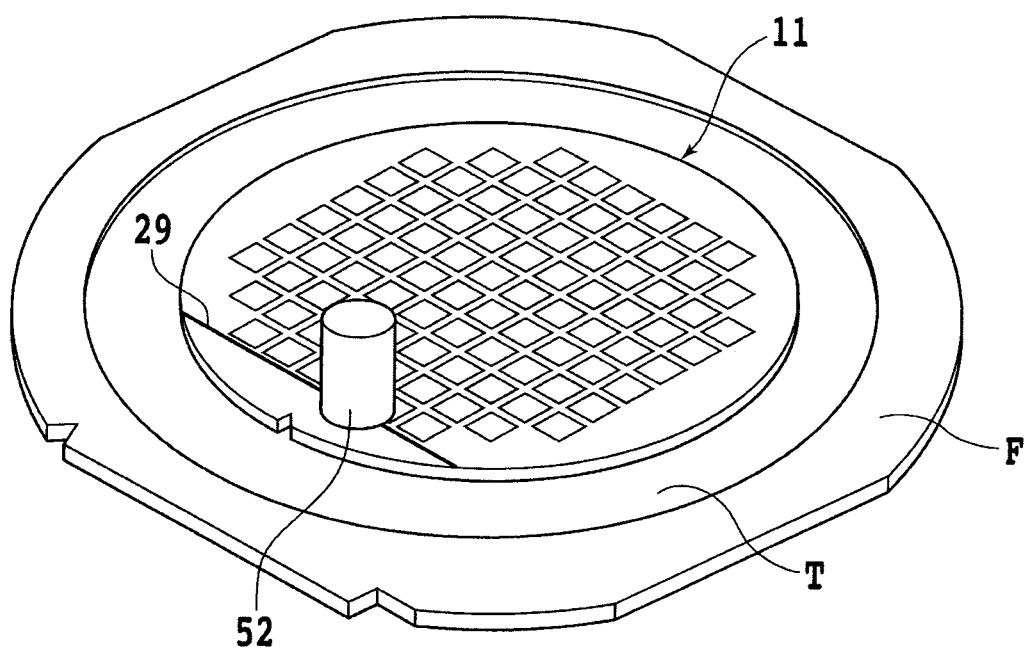
FIG. 8 is a schematic perspective view showing the manner in which an image of a cut groove formed in the processing step is captured by an image capturing unit.
Figure 9:
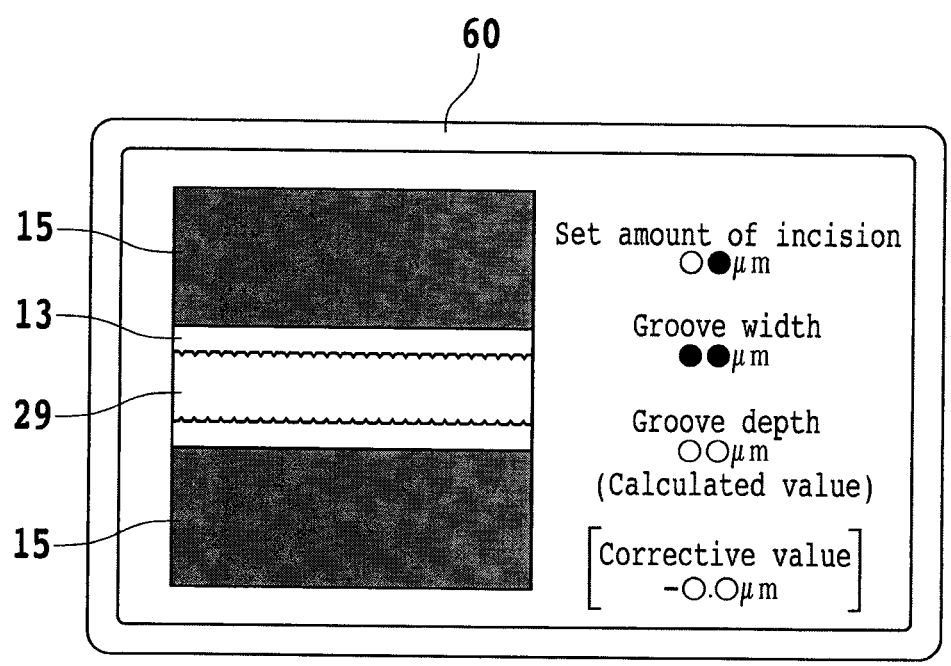
FIG. 9 is a view showing a captured image of the cut groove which is displayed on the display monitor.

FIG. 8 shows in perspective the manner in which an image of the cut groove 29 of the predetermined depth D is captured by the image capturing unit 52. As shown in FIG. 9, the captured image of the cut groove 29 is displayed on the display monitor 60 for a kerf check. It can be seen from the captured image shown in FIG. 9 that the low-k films are not flaked off when the cut groove 29 of the predetermined depth are formed.

Figure 10:
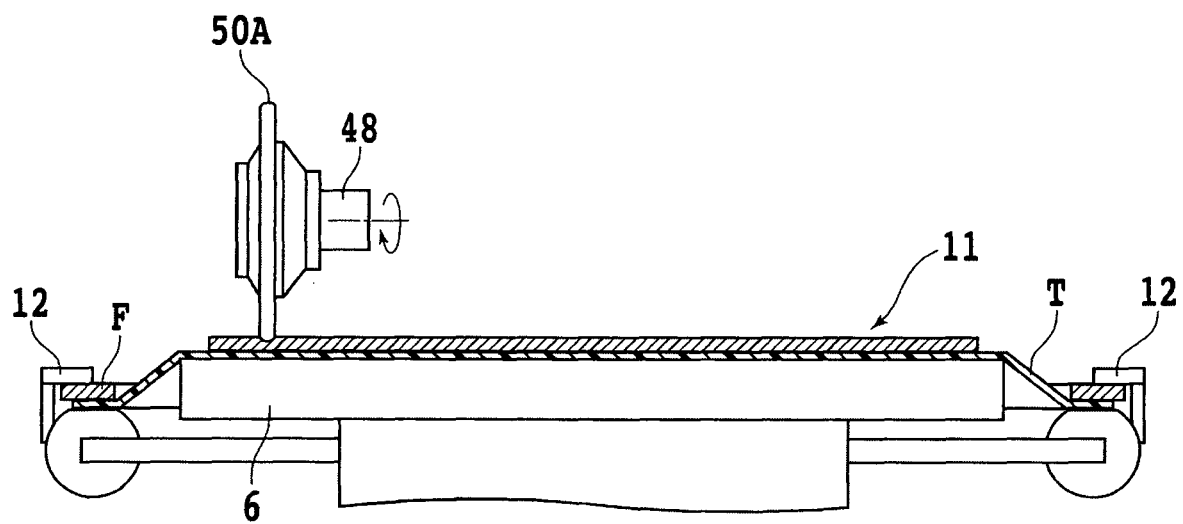
FIG. 10 is a side elevational view, partly in cross section, illustrating a preliminary cut groove forming step which is carried out by a cutting blade having a cross-sectionally U-shaped tip end.
Figure 11:
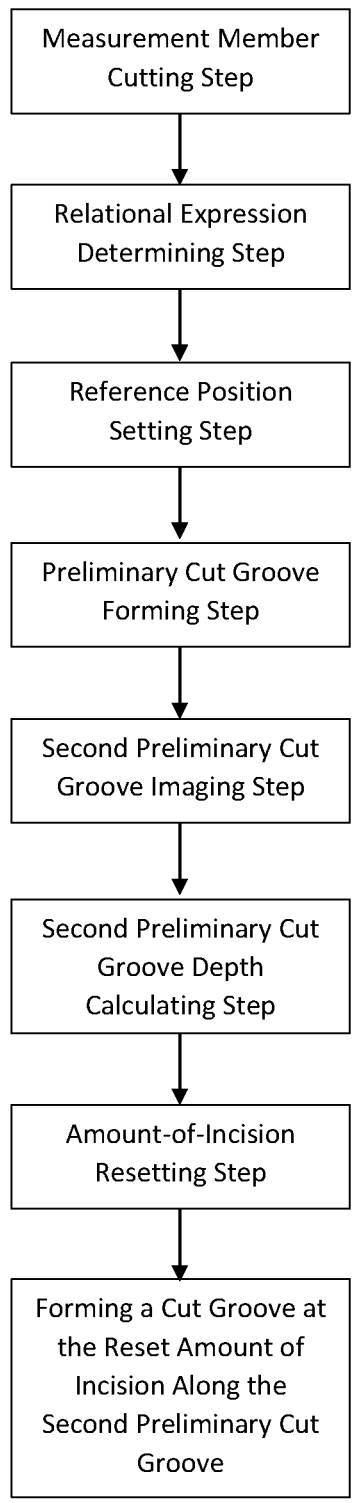
FIG. 11 is a flow chart illustrating the steps of the method of forming a cut groove in a workpiece.

FIG. 10 illustrates in side elevation, partly in cross section, the method of forming a cut groove according to the present invention with a cutting blade 50A having a cross-sectionally U-shaped tip. Although the relational expression determining step, the preliminary cut groove forming step, and the processing step are carried out using the cutting blade 50 having a cross-sectionally V-shaped tip end in the above embodiment, these steps may be performed using the cutting blade 50A with the cross-sectionally U-shaped tip end.

Since the upper surface (holding surface) of the chuck table 6 does not lie exactly horizontally as described above, the preliminary cut groove forming step for forming the second preliminary cut groove 27 along a projected dicing line 13 should preferably be carried out along a plurality of projected dicing lines 13 by moving the first cutting unit 46 along a Y-axis direction in a processing feed mode. After the preliminary cut groove forming step has been carried out along the plural projected dicing lines 13, a depth calculating step for calculating the depth of the second preliminary cut groove 27 and an amount-of-incision resetting step are carried out again, and a processing step is carried out with respect to a projected dicing line 13 subsequent to the projected dicing lines 13, using the reset amount of incision.

Inasmuch as the wafer 11 generally has a thickness variation in the range of about 1 μm to 3 μm, the surface height of the wafer 11 may be measured by a surface height measuring apparatus and the processing step may be carried out in order to follow up a change in the height. In the measurement member cutting step, the cross-sectional shape of the cut measurement member has been illustrated as being observed by the microscope. However, a plurality of first preliminary cut grooves 21 having incision depths that are different from each other by 1 μm, for example, may be formed in the measurement member, planar images of the formed first preliminary cut grooves 21 may be captured by image capturing means, and their groove widths may be measured, so that a relational expression (table) as shown in Table 1 may be produced.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A method of forming a cut groove having a predetermined depth in a workpiece with a cutting blade along a projected dicing line set on the workpiece, the method comprising:

a relational expression determining step of cutting a measurement member with the cutting blade to form a first preliminary cut groove in the measurement member and determining a relational expression between a distance from a groove bottom of the first preliminary cut groove and a groove width of the first preliminary cut groove, wherein the relational expression is based on the distance from the groove bottom and the groove width at a plurality of locations along the first preliminary cut groove, and wherein the measurement member is separated from the workpiece;

a reference position setting step of setting a position where a tip end of the cutting blade and a holding surface of a chuck table contact each other as a reference position having a reference depth for an incising feeder configured for moving the cutting blade and the chuck table relative to each other along an incising feed direction perpendicular to the holding surface of the chuck table;

a preliminary cut groove forming step of, after the relational expression determining step and the reference position setting step have been carried out, setting an initial amount of incision into the workpiece as being less than or equal to a predetermined depth based on the reference depth of the reference position and a thickness of the workpiece, and forming a second preliminary cut groove in the workpiece held on the chuck table with the cutting blade along the projected dicing line;

a depth calculating step of, after the preliminary cut groove forming step has been carried out, capturing an image of the second preliminary cut groove, measuring a groove width of the second preliminary cut groove, and calculating a depth of the second preliminary cut groove based on the groove width of the second preliminary cut groove by using the relational expression and the groove width of the second preliminary cut groove;

an amount-of-incision resetting step of resetting a final amount of incision for the cutting blade to form a final cut groove having a final predetermined depth in the workpiece, using a corrective value represented by the difference between the initial amount of incision set in the preliminary cut groove forming step and the depth of the second preliminary cut groove calculated in the depth calculating step, wherein said final predetermined depth is a depth by which the cutting blade completely severs the workpiece; and a processing step of, after the amount-of-incision resetting step has been carried out, forming the final cut groove having the final predetermined depth in the workpiece with the cutting blade along the projected dicing line by the final amount of incision set in the amount-of-incision resetting step.

2. The method of forming a cut groove according to claim 1, wherein the processing step includes cutting the final cut groove along the second preliminary cut groove.

3. The method of forming a cut groove according to claim 1, wherein the preliminary cut groove forming step, the depth calculating step, and the amount-of-incision resetting step are carried out a plurality of times along different projected dicing lines with respect to the workpiece held on the chuck table.

4. The method of forming a cut groove according to claim 1, wherein the first preliminary cut groove, the second preliminary cut groove and the final cut groove are formed using the tip end of the cutting blade, wherein the tip end is a cross-sectionally U-shaped tip end.

5. The method of forming a cut groove according to claim 1, further comprising, after capturing the image of the second preliminary cut groove, displaying the image of the second preliminary cut groove on a display monitor.

6. The method of forming a cut groove according to claim 1, wherein the first preliminary cut groove, the second preliminary cut groove and the final cut groove are formed using the tip end of the cutting blade, wherein the tip end is a cross-sectionally V-shaped tip end.

7. The method of forming a cut groove according to claim 1, further comprising storing the relational expression determined in the relational expression determining step in a memory device of a controller.

8. The method of forming a cut groove according to claim 7, wherein the step of calculating the depth of the second preliminary cut groove from the groove width of the second preliminary cut groove uses the relational expression stored in the memory device.

* * * * *